United States Patent
Sharma et al.

(10) Patent No.: US 7,167,391 B2
(45) Date of Patent: Jan. 23, 2007

(54) MULTILAYER PINNED REFERENCE LAYER FOR A MAGNETIC STORAGE DEVICE

(75) Inventors: Manish Sharma, Sunnyvale, CA (US); Janice Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 197 days.

(21) Appl. No.: 10/775,807

(22) Filed: Feb. 11, 2004

(65) Prior Publication Data

US 2005/0174836 A1    Aug. 11, 2005

(51) Int. Cl.
*G11C 11/00*    (2006.01)
(52) U.S. Cl. .................. 365/173; 365/158; 365/171
(58) Field of Classification Search ............... 365/158, 365/171, 173; 360/207.21, 324.11
See application file for complete search history.

(56) References Cited

U.S. PATENT DOCUMENTS

| | | | |
|---|---|---|---|
| 6,191,577 B1 * | 2/2001 | Sasaki et al. ........... 324/207.21 |
| 6,248,416 B1 * | 6/2001 | Lambeth et al. ......... 428/832.2 |
| 6,358,757 B1 | 3/2002 | Anthony | |
| 6,400,535 B1 * | 6/2002 | Shimazawa et al. ..... 428/811.2 |
| 2003/0057461 A1 | 3/2003 | Tran et al. | |
| 2003/0169620 A1 | 9/2003 | Sharma et al. | |
| 2004/0170054 A1 * | 9/2004 | Mattheis et al. ............ 365/171 |

OTHER PUBLICATIONS

A.E. Berkowitz et al. "Exchange Anisotropy—A Review", Journal of Magnetizm and Magnetic Materials 200(1999) 552-570 (Mar. 12, 1999).

J. Nogues, Ivan K. Schuller "Exchange Bias", Journal of Magnetizm and Magnetic Materials 192(1999) 203-232 (Mar. 5, 1998).

* cited by examiner

*Primary Examiner*—Gene N. Auduong

(57) ABSTRACT

This invention provides a multilayer pinned reference layer for a magnetic device. In a particular embodiment a magnetic tunnel junction cell is provided. Each magnetic memory tunnel junction cell provides at least one ferromagnetic data or sense layer, an intermediate layer in contact with the data layer, and a multilayer pinned ferromagnetic reference layer. The multilayer pinned reference layer is in contact with the intermediate layer, opposite from the data layer. The multilayer pinned reference layer is characterized by at least one first layer of ferromagnetic material and at least one second layer of ferromagnetic material in physical contact with the first layer and magnetically coupled to the first layer. The first and second layer self seed to provide a <111> crystal texture used in establishing the pinning magnetic field of the reference layer.

37 Claims, 5 Drawing Sheets

MULTILAYER PINNED REFERENCE LAYER FOR A MAGNETIC STORAGE DEVICE

FIELD OF THE INVENTION

This invention relates generally to magnetic memory devices and in particular to pinned reference layers as used in magnetic random access memory (commonly referred to as "MRAM").

BACKGROUND OF THE INVENTION

Today's computer systems are becoming increasingly sophisticated, permitting users to perform an ever greater variety of computing tasks at faster and faster rates. The size of the memory and the speed at which it can be accessed greatly influences upon the overall speed of the computer system.

Generally, the principle underlying the storage of data in a magnetic media (main or mass storage) is the ability to change, and/or reverse, the relative orientation of the magnetization of a storage data bit (i.e. the logic state of a "0" or a "1"). The coercivity of a material is the intensity of the magnetic field needed to reverse the magnetization of a ferromagnetic material along it's easy axis. Generally speaking, the smaller the magnetic particle the higher it's coercivity.

A prior art magnetic memory cell may be spin valve device such as a tunneling magneto-resistance memory cell (TMR), a giant magneto-resistance memory cell (GMR), or a colossal magneto-resistance memory cell (CMR). These types of memory may be commonly referred to as spin valve memory. As shown in prior art FIGS. 1A and 1B a magnetic tunnel junction memory 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material.

The data layer 101 is usually a layer of magnetic material that stores a bit of data as an orientation of magnetization M2 that may be altered in response to the application of an external magnetic field or fields. More specifically, the orientation of magnetization M2 of the data layer 101 representing the logic state can be rotated (switched) from a first orientation representing a logic state of "0" to a second orientation, representing a logic state of "1", and/or vice versa.

The reference layer 103 is usually a layer of magnetic material in which an orientation of magnetization M1 is "pinned", as in fixed, in a predetermined direction. The direction is predetermined and established using either a hard magnet with a coercivity greater than the free layer or by using an anti-ferromagnetic material (AFM) pinning layer with an appropriate anneal.

The data layer 101 and reference layer 103 may be thought of as stacked bar magnets, where the x axis 107 is longer than the y axis 109, i.e, it has shape anisotropy. The magnetization of each layer has a strong preference to align along the easy axis, generally the long X axis 107. The short Y axis 109 is the hard axis. As with traditional bar magnets, the data layer and reference layer each have magnetic poles, one at either end of the easy axis. The lines of magnetic force that surround the data layer and reference layer respectively are three-dimensional and flow from the North to the South pole.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in a SVM 100, electrons migrate between the data layer 101 and the reference layer 103 through the intermediate layer 105. With TMR cells, the material comprising the intermediate layer 105 is typically a thin dielectric layer commonly referred to as a tunnel barrier layer. The phenomena that cause the migration of electrons through the barrier layer may be referred to as quantum mechanical tunneling or, since in FM materials each spin state has a different accessible density of states, spin tunneling.

Continuing with the model of an elemental bar magnet, the magnetization of the data layer 101 is free to rotate, but with a strong preference to align in either direction along the easy axis 107 of the data layer 101. The reference layer 103 likewise is aligned along the easy axis 107 but is pinned in a fixed alignment such that it does not freely rotate in the applied field of interest. The logic state may be determined by measuring the resistance of the memory cell. For example, if the overall orientation of the magnetization in the data layer 101 is parallel to the pinned orientation of magnetization in the reference layer 103 the magnetic memory cell will be in a state of low resistance. If the overall orientation of the magnetization in the data layer 101 is anti-parallel (opposite) to the pinned orientation of magnetization in the reference layer 103 the magnetic memory cell will be in a state of high resistance.

The pinned nature of the reference layer 103 is typically established with the use of an AFM material in direct physical contact with a ferromagnetic (FM) material. AFM materials magnetically order below their Neel temperatures ($T_N$), the temperature at which they become anti-ferromagnetic or anti-ferrimagnetic. The Neel temperature of AFM materials is analogous to the Curie Temperature ($T_C$) of FM materials, the temperature above which a FM loses it's ability to possess an ordered magnetic state in the absence of an external magnetic field. Generally $T_C$ of the FM is greater than $T_N$ of the AFM.

With respect to a traditional bar magnet there are two equally stable easy spin directions (each rotated 180 degrees) along the easy axis. Alignment in either direction requires the same energy and requires the same external field to align the spin of the atomic particles and thus the magnetic field M1, in either direction as shown by the hysteresis loop 201 for a simple FM in FIG. 2A.

In establishing a reliable pinned field, it is desirable to establish a preferred orientation along one direction of an axis, typically the easy axis although in some situations it may be the hard axis. By growing the FM on an AFM in a magnetic field H or annealing in field H at a temperature above the Neel temperature of the AFM, the hysteresis loop 205 (FM+AFM+H) becomes asymmetric and is shifted, see FIG. 2B. In general, this shift is significantly greater than H, on the order of a couple hundred Oe. This unidirectional shift is called the exchange bias and demonstrates that there is now a preferred easy axis alignment direction.

The annealing step typically takes time, perhaps an hour or more. In the annealing step the reference layer 103 is heated to a temperature greater than $T_N$ while a magnetic field is applied. As the temperature is lowered through $T_N$, the spin of the AMF molecules at the interface between the AFM and FM layers will order and couple to the aligned FM spin. Such ordering of the AFM exerts a torque upon the FM material and results in establishing the pinned orientation of the reference layer 103.

As the reference layer 103 is but one part of the memory being produced, the entire memory must be subject to temperatures ranging from about 200 to 300 degrees centigrade while under the influence of an applied magnetic field. Such manufacturing stresses may inadvertently weaken the reference layer 103, leading to an unstable reference field. In addition, the characteristics of the data layer 101 may be unknowingly affected by heat during some manufacturing processes.

The ability to establish the pinned field within the pinned ferromagnetic reference layer 103 is dependent upon the crystalline texture of the ferromagnetic materials and AFM comprising the reference layer 103. Typically, when the pinned reference layer 103 is fabricated on the bottom of the memory structure (a bottom-pinned structure), a layer of suitably lattice matched, generally non-ferromagnetic, material is used to seed the development of a desired crystal structure within a second ferromagnetic seed layer, and the subsequent AFM pinning layer; this texture is propagated in the ferromagnetic reference layer 103. When the AFM layer has been seeded properly, growing the FM layer upon the AFM layer is generally less complicated and consistently results in a desirable crystalline structure For design and application purposes it is often desirable to have the pinned reference layer 103 above the data layer 101 (a top-pinned structure). This type of structure is difficult to fabricate as the application of the intermediate layer 105 acting as the tunnel junction barrier effectively terminates the propagation of the crystal structure and reapplication of a new non-ferromagnetic seed layer is not possible as the spin dependence is then lost. Growing the AFM layer upon the FM layer (inverse of the order in a bottom-pinned structure) typically involves high energy ion fields and other processes attempting to induce proper crystalline texture. Fabrication of the top reference layer 103 with proper texture in the AFM layer is therefore difficult In addition, since the AFM layer does not have good texture, the resulting exchange fields are often low, causing the hysteresis loop of the pinned layer to overlap with that of the data layer. This overlap is commonly referred to as the pinned loop spread. As a result of pinned loop spread, the magnetic field applied to switch the state of the data layer must not only be sufficient to overcome the coercivity of the data layer, but also must be sufficient to overcome the influence of the magnetic field overlapping from the pinned reference layer. Furthermore, the required applied fields to switch the bit are asymmetric.

With respect to magnetic memory components, it is well known that as the bit size decreases, it's coercivity increases. A large coercivity is generally undesirable, as it requires a greater magnetic field to be switched, which in turn requires a greater power source and potentially larger switching transistors. Providing large power sources and large switching transistors is generally at odds with the established trends to reduce the size of components. In addition, to mitigate the potential of inadvertently switching a neighboring memory cell, nanometer scaled memory cells are generally more widely spaced relative to their overall size than are non-nanometer sized memory cells. Moreover, as the size of the magnetic memory decreases, the unused space between individual memory cells tends to increase.

Hence, in a typical MRAM array a significant amount of overall space may be used simply to provide a physical buffer between the cells. Absent this buffering space, or otherwise reducing it's ratio, a greater volume of storage in the same physical space could be obtained.

These issues and current design of the magnetic memory cells also carry over into the design and use of magnetic field sensors such as those commonly used in hard drive read cells and read heads. In such implementation, the data layer 101 is termed a sense layer and is oriented by the magnetic field emanating from a storage bit proximate to the read head.

Hence, there is a need for an ultra-high density magnetic memory with a pinned reference layer which overcomes one or more of the drawbacks identified above. The present invention satisfies one or more of these needs.

SUMMARY

This invention provides a magnetic memory device incorporating a pinned reference layer.

In particular, and by way of example only, according to an embodiment of the present invention, this invention provides a multilayer pinned reference layer for a magnetic storage device, including: at least one first layer of magnetic material; and at least one second layer of magnetic material in physical contact with the first layer.

Moreover, according to an embodiment thereof, the invention may provide a multilayer pinned reference layer for a magnetic storage device, including: at least one first layer of CoFe with a uniform thickness of between about 0 to 5 nanometers; and at least one second layer of NiFe with a uniform thickness of between about 0 to 4 nanometers, the second layer magnetically coupled to the first layer.

Further, according to an embodiment thereof, the invention may provide a magnetic memory device including: at least one ferromagnetic data layer characterized by an alterable orientation of magnetization; an intermediate layer in contact with the data layer; a multilayer pinned ferromagnetic reference layer in contact with the intermediate layer, opposite the data layer, the reference layer characterized by; at least one first layer of magnetic material; and at least one second layer of magnetic material in physical contact with the first layer, the second layer magnetically coupled to the first layer; wherein the first and second layers provide a self seeded structure with good <111> texture, such that high exchange coupling is obtained in top pinned structures; and an antiferromagnetic pinning layer.

These and other objects, features and advantages of the preferred method and apparatus will become apparent from the following detailed description, taken in conjunction with the accompanying drawings which illustrate, by way of example the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory, any magnetic sensors or other magnetic field devices.

Figure 1A:
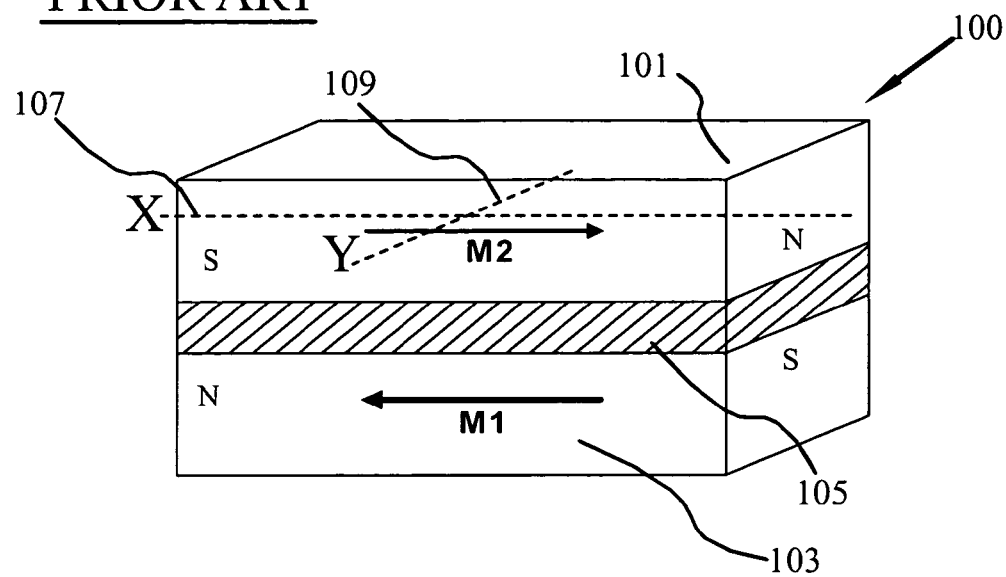
FIGS. 1A~1B show perspective views of a prior art magnetic memory cell.
Figure 1B:
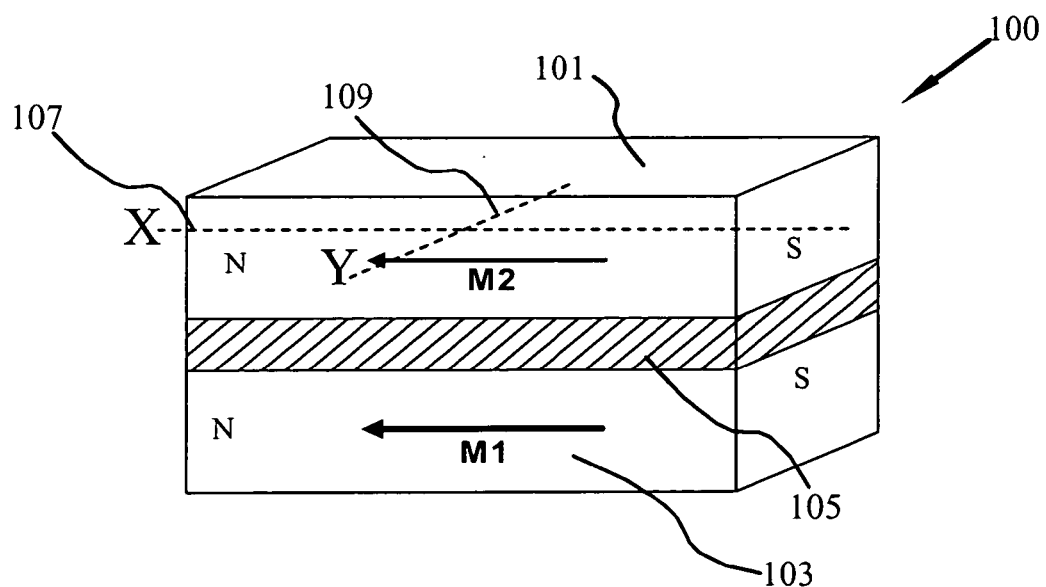
Figure 2A:
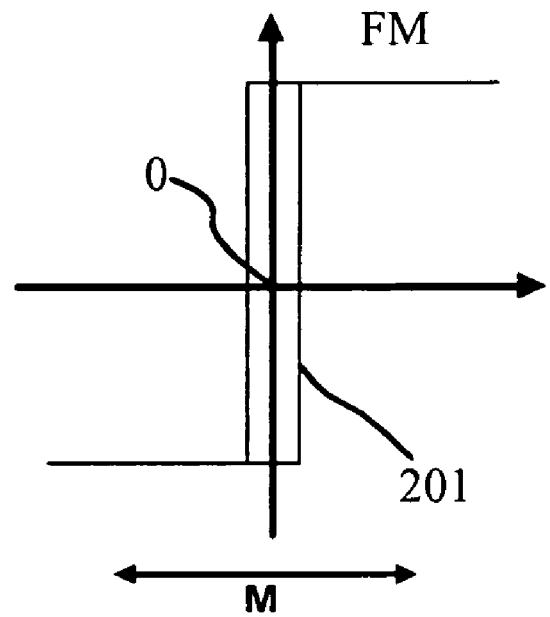
FIGS. 2A~2B show symmetrical hysteresis loops for un-biased and biased reference layers.
Figure 2B:
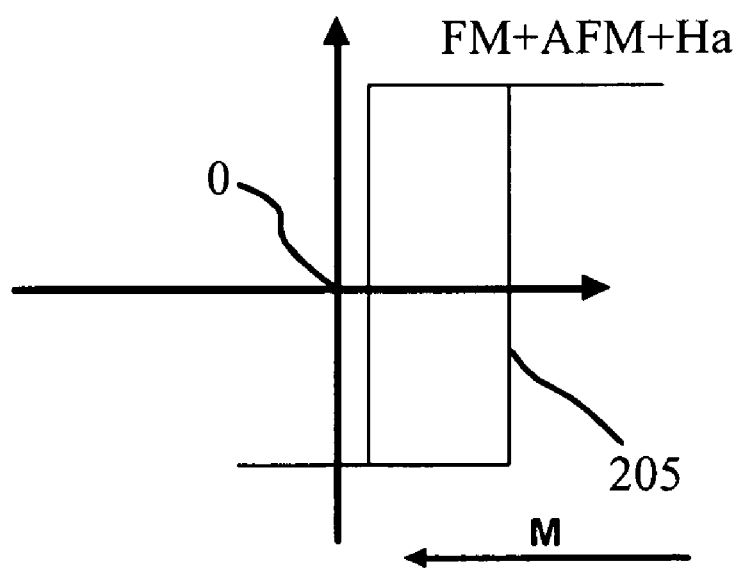
Figure 3A:
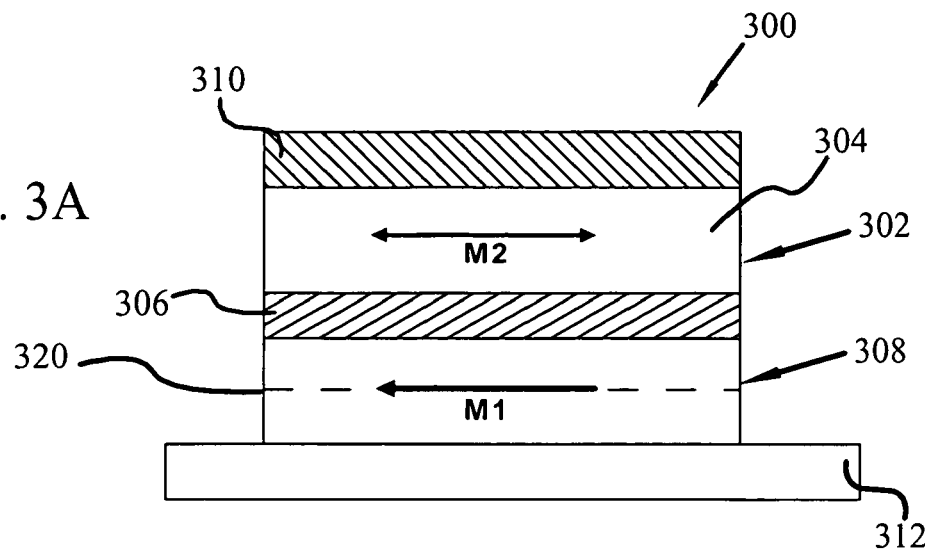
FIG. 3A is a cross-sectional side view of a magnetic memory cell with a multilayer pinned reference layer according to the present invention in bottom-pinned configuration.
Figure 3B:
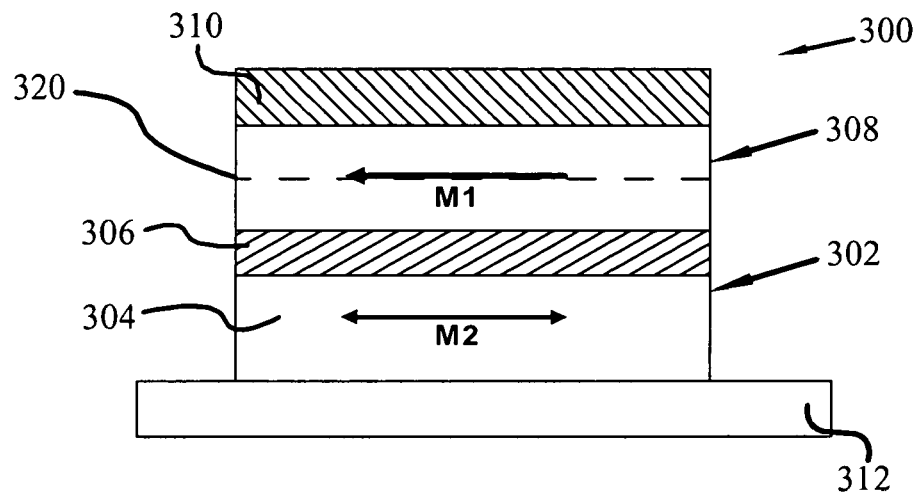
FIG. 3B is a plain view of an alternative embodiment of a magnetic memory cell with a multilayer pinned reference layer according to the present invention in top-pinned configuration.

Referring now to the drawings, and more particularly to FIGS. 3A and 3B, there is shown a portion of a magnetic memory 300 comprising at least one spin valve memory cell 302 (SVM), according to an embodiment of the present invention. More specifically, SVM 302 has at least one ferromagnetic data layer 304, an intermediate layer 306, and a multilayer ferromagnetic pinned reference layer 308 (multilayer PRL). FIG. 3A conceptually illustrates a bottom-pinned spin valve structured device, while FIG. 3B illustrates a top-pinned spin valve structured device.

The intermediate layer 306 has opposing sides such that the data layer 304 in contact with one side is in direct alignment with, and substantially uniformly spaced from, the multilayer PRL 308, in contact with the second side of the intermediate layer 306. The multilayer PRL 308 has a pinned orientation of magnetization M1. The ferromagnetic data layer 304 permits the storing of a bit of data as an alterable orientation of magnetization M2. To achieve a magnetic memory storage device such as MRAM, the SVM 302 may be placed in electrical contact with an electrically conductive row 310 transverse to an electrically conductive column 312.

Figure 3C:
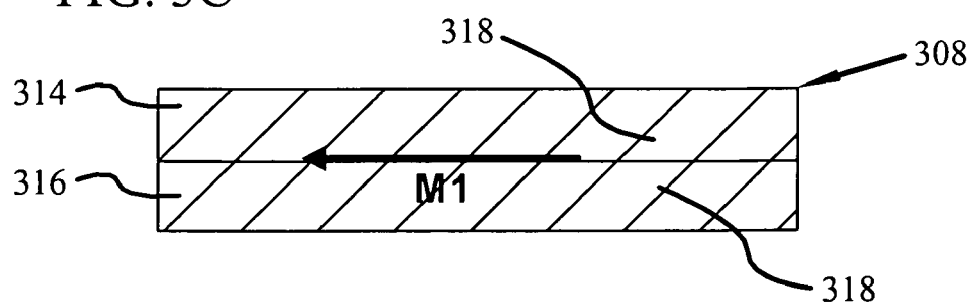
FIG. 3C is an enlargement of the multilayer pinned reference layer shown in FIGS. 3A and 3B.

The characteristics of the multilayer PRL 308 may be more fully appreciated with respect to FIG. 3C. The multilayer PRL 308 may be a graded layer. For conceptual simplicity it has been illustrated as having two primary layers. More specifically, the multilayer PRL 308 is comprised of at least one first layer 314 of magnetic material and at least one second layer 316 of magnetic material in physical contact with the first layer 314. The first layer 314 and second layer 316 are magnetically coupled. As is discussed below, to establish the pinned orientation of the multilayer PRL 308 it is generally accepted that the combined FM structure (the first layer 314 and the second layer 316) be disposed substantially proximate to an anti-ferromagnetic material (AFM), represented as AFM layer 322. FIG. 3C illustrates the AFM layer at the top of the multilayer PRL 308 structure, as would occur in a top-pinned structure as illustrated in FIG. 3B.

For conceptual simplicity and ease of discussion, the data layer 304 is represented as a single layer. Similarly, the multilayer PRL 308 is represented with a first layer 314 and a second layer 316. Under appropriate circumstances the data layer 304 may be formed from multiple layers. In some applications the ferromagnetic data layer 304 may have a lower coercivity then the multilayer PRL 308, and may be made from a material that includes, but is not limited to: Nickel, Iron, Cobalt, and alloys of these metals. In at least one embodiment the first layer 314 and second layer 316 are both selected from ferromagnetic (FM) materials. More specifically, in at least one embodiment the first layer 314 is Cobalt Iron (CoFe) and the second layer 316 is Nickel Iron (NiFe).

It has been found by experimentation that certain substantially uniform thicknesses of the first 314 and second layers 316 result in a pinned reference layer with advantageous properties. Table 1 illustrates the resulting characteristics of a multilayer PRL 308 characterized by a first layer 314 of CoFe having a uniform thickness of between about 0 to 5 nanometers, and a second layer 316 of NiFe having a uniform thickness of between about 0 to 4 nanometers. As shown, when the first layer 314 is CoFe and provided in a thickness of about between 0.5 and 1 nanometers and the second layer 316 of NiFe is provided in a thickness of about between 2 and 4 nanometers, the combined layer 308 has a self seeding property and demonstrates very desirable pinning properties when coupled with and AFM pinning layer.

TABLE 1

| CoFe (nm) | NiFe (nm) | Pinning Field (Oe) | Pinned Loop Spread (Oe) |
|---|---|---|---|
| 0 | 4 | 0 | N/A |
| 0.5 | 0 | 0 | 0 |
| 0.5 | 1 | 0 | 0 |
| 0.5 | 2 | 300 | 150 |
| 0.5 | 4 | 200 | 150 |
| 1 | 0 | 0 | 0 |
| 1 | 1 | 0 | 0 |
| 1 | 2 | 400 | 100 |
| 2 | 0 | 0 | 0 |
| 2.5 | 0 | 50 | 50 |
| 4 | 0 | 250 | 250 |
| 5 | 0 | 200 | 200 |

Figure 5:
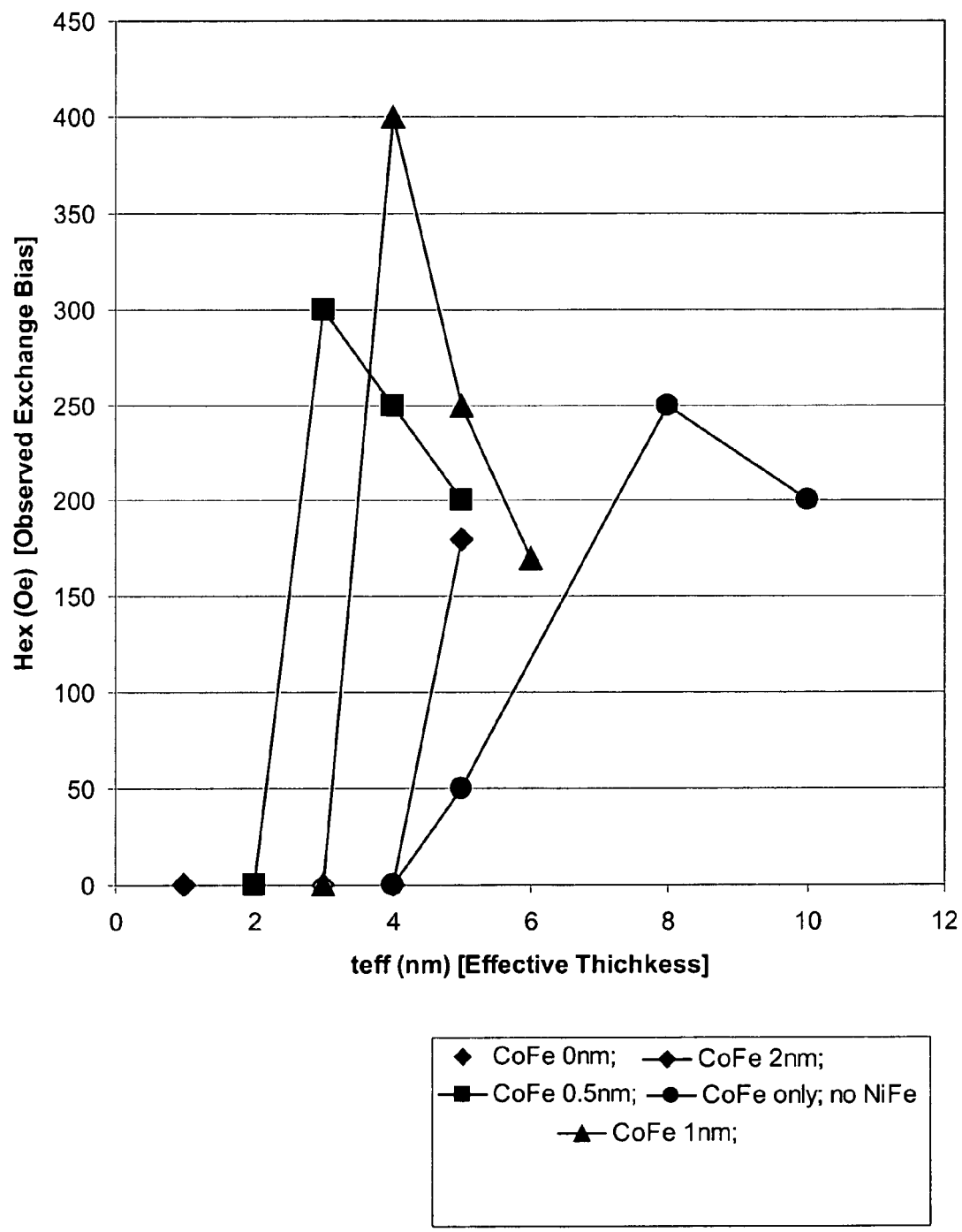
FIG. 5 is a graph demonstrating the advantageous properties of the multilayer pinned reference layer as shown in FIGS. 3A–3C and 4.

The advantageous properties of the multilayer PRL 308 regarding the Pinning Field and Pinned Loop Spread may be more fully appreciated with respect to the graph provided in FIG. 5. As shown, establishing a layer of only NiFe without CoFe produces no exchange bias, whereas the bias increases as the present thickness of CoFe increases, indicating that the texture is improving. The upper bound of thickness is determined by achieving the most desirable properties—i.e. good Pinning Field and low Pinned Loop Spread The selection of Co(x)Fe(y) is determined by the resulting characteristics desired in the pinned spin valve device, with a 50/50 ratio demonstrating the maximum exchange bias. In at one embodiment Co50Fe50 is employed for, among other benefits, providing high exchange. In an alternative embodiment Co60Fe40 may be employed for, among other benefits, increased spin polarization.

Establishing a pinning field within a reference layer requires that the crystal texture of the material within the AFM pinning layer be a <111> crystal texture. For top pinned structures, this is accomplished by establishing a <111> texture in the reference layer which is then propagated into the AFM pinning layer. This provides a substantially constant force acting to maintain the pinned orientation of magnetization.

Advantageously over the prior art, the direct physical contact and interaction between the first layer 314 and the second layer 316 permits the materials to self seed in providing the <111> crystal texture, represented as hash lines 318, within the multilayer PRL 308. More simply stated, multilayer PRL 308 is advantageous because it is self seeding. In at least one embodiment the first layer 314 is CoFe and the second layer 316 is NiFe.

Where the multilayer PRL 308 occurs in a bottom-pinned SVM, the self seeding action is enhanced by the presence of an appropriate non-ferromagnetic seeding material layer such as Ta, Ru, Cu/Ru, Ta/Ru, Ta/Cu or multiple layer combinations thereof. Where the multilayer PRL 308 occurs in a top-pinned SVM, the self seeding action advantageously establishes the desired <111> crystal texture, which is otherwise halted in propagation from the lower ferromagnetic layers by the intermediate layer 306.

More specifically, the first layer 314 of CoFe and the second layer 316 of NiFe provide the <111> crystal texture 318 without requiring the presence of an initial seed layer or treatment with <111> crystal texture inducing ion energy. Under appropriate circumstances, such a seed layer and/or additional ion energy may be combined with the self seeding nature of the first layer 314 of CoFe and the second layer 316 of NiFe to further enhance the quality of the <111> crystal texture.

Moreover, in at least one embodiment the initial first layer 314 of CoFe itself acts as a seed layer for the subsequent growth of the second layer 316 of NiFe. In addition, the physical contact between the two layers 314, 316 establishes the multilayer PRL 308 with good exchange properties when combined with an AFM pinning layer. As introduced above, the multilayer PRL 308 may be conceptually viewed as a single bar magnet having an easy axis in line with it's longitudinal axis 320.

To establish the pinned orientation of the multilayer PRL 308 it is generally accepted that the combined FM structure (the first layer 314 and the second layer 316) be disposed substantially proximate to an AFM material 322 such as, for example, IrMn, to permit interfacial exchange interaction between the FM and AFM materials. Because of the self seeding nature of multilayer PRL 308 to grow with <111> crystal texture 318, and propagate the <111> crystal structure to a AFM layer 322, without requiring the first 314 and second layers 316 be grown upon a seed layer, the multilayer PRL 380 is advantageous over the prior art.

Figure 4:
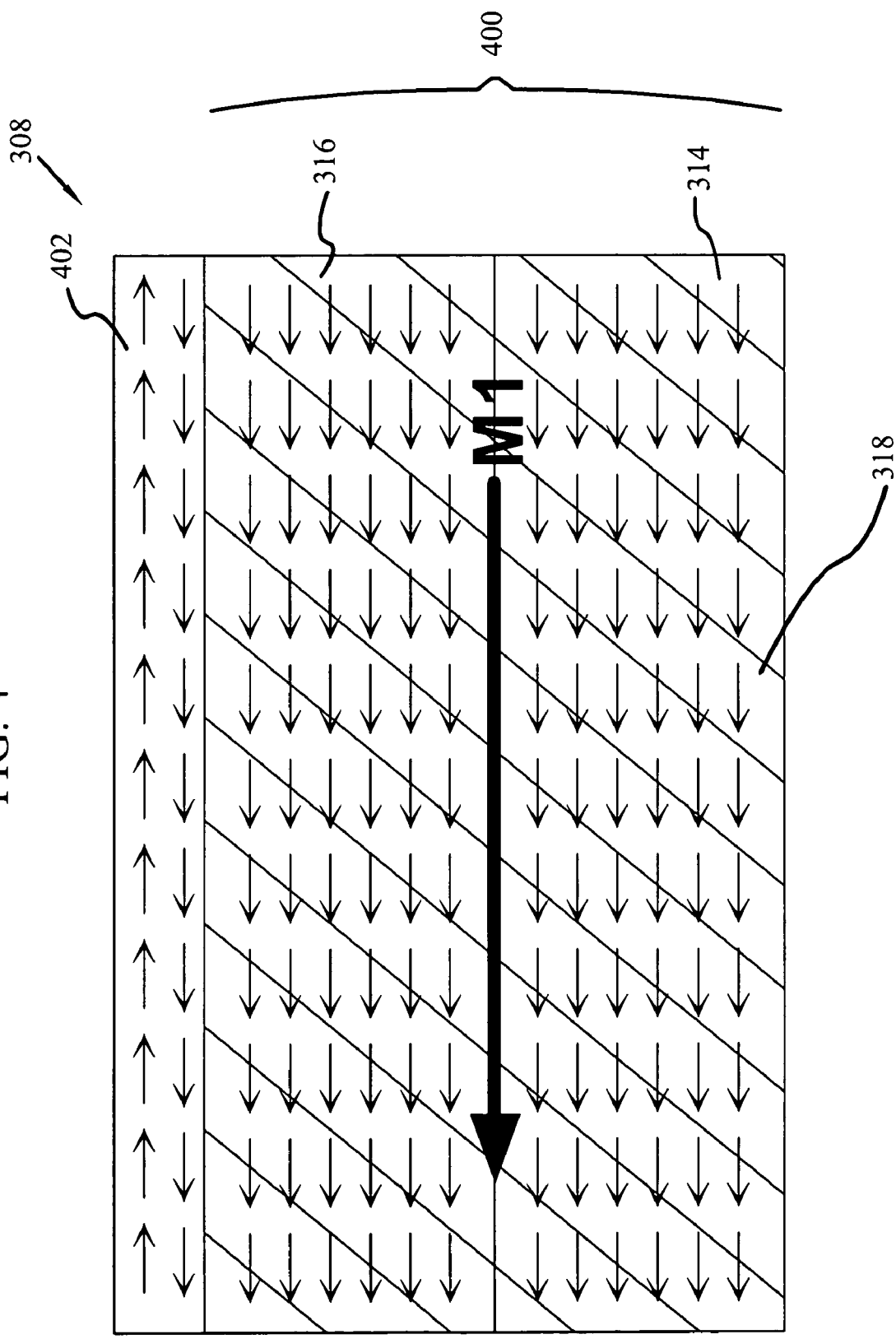
FIG. 4 is a further enlargement of the multilayer pinned reference layer shown in FIG. 3C.

More specifically, as shown in FIG. 4, the multilayer PRL 308 magnetically acts as a single FM layer 400. Due to the self seeding property of the multilayer, and the resultant desired <111> orientation of the FM layer 400 and the subsequent AFM layer 402, a substantial exchange coupling is formed between the FM layer 400 and the AFM layer 402, especially when the AFM layer 402 is added after the multilayer PRL 308 is created. When an AFM 402 is provided after the first layer 314 and second layer 316 are established and the structure is presented to an appropriate annealing process and magnetic field, a desirable exchange bias will result in the FM materials of the multilayer PRL 308. More specifically, this structure provides an exchange field greater than the coercivity the reference layer. As a result, the first 314 and second layers 316 provide the desired magnetic pinning field M1 in the appropriate orientation.

This multilayer PRL 308 reduces the manufacturing complexities typically associated with the fabrication of top-pinned magnetic memory device. As a top-pinned structure permits the data layer 304 to be grown directly on top of a seed layer, the resulting structure is smoother than is otherwise achieved with bottom-pinned magnetic memory devices.

The improved smoothness of the structure provides for greater uniformity and thus greater controlled magnetic properties. Moreover, reducing the roughness of the data layer 304 reduces ferromagnetic coupling, magnetostriction and magnetic anisotropy. In addition, the data layer 304 may be placed closer to the bottom conductor, such as the word line of the bottom electrode, thus improving it's response to electrical pulses provided by the bottom conductor word line. Such improved response to a pulse provides for improved bit switching and reduces switching field requirements. The multilayer PRL 308 therefore permits an improved top-pinned magnetic memory device.

The phenomenon that causes the resistance in the SVM 302 is well understood in the magnetic memory art and is well understood for TMR memory cells. GMR and CMR memory cells have similar magnetic behavior but their magneto-resistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 306 is a thin barrier of dielectric material through which electrons quantum mechanically tunnel between the data layer 304 and the multilayer PRL 308.

In a GMR memory cell, the intermediate layer 306 is a thin spacer layer of non-magnetic but conducting material. Here the conduction is a spin-dependent scattering of electrons passing between the data layer 304 and the multilayer PRL 308 though the intermediate layer 306. In either case, the resistance between the data layer 304 and the multilayer PRL 308 will increase or decrease depending on the relative orientations of the magnetizations M1 and M2. It is that difference in resistance that is sensed to determine if the data layer 304 is storing a logic state of "0" or a logic state of "1".

In at least one embodiment, the intermediate layer 306 is a tunnel layer made from an electrically insulating material (a dielectric) that separates and electrically isolates the data layer 304 from the multilayer PRL 308. Suitable dielectric materials for the dielectric intermediate layer 306 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 306 is a tunnel layer made from a non-magnetic material such as a 3d, a 4d, or a 5d transition metal listed in the periodic table of the elements. Suitable non-magnetic materials for a non-magnetic intermediate layer 306 may include, but are not limited to: Copper (Cu), Gold (Au) and Silver (Ag). While the actual thickness of the intermediate layer 306 is dependent upon the materials selected to create the intermediate layer 306 and the type of tunnel memory cell desired, in general, the intermediate layer 306 may have a thickness of about 0.5 nm to about 3.0 nm.

As shown in Table 1 above, the multilayer composition of the PRL 308 involving CoFe and NiFe reduces the loop spread of the PRL 308. As discussed above, the logic state of a SVM 302 may be determined by measuring the resistance within the memory cell. For example, if the overall orientation of the magnetization in the data layer 304 is parallel to the pinned orientation of magnetization in the multilayer PRL 308 the magnetic memory cell will be in a state of low resistance. If the overall orientation of the magnetization in the data layer 304 is anti-parallel (opposite) to the pinned orientation of magnetization in the multilayer PRL 308 the magnetic memory cell will be in a state of high resistance.

In memory applications, the orientation of the alterable magnetization of the data layer 304 is either parallel or anti-parallel with respect to the magnetization of the multilayer PRL 308. In prior art magnetic tunnel junction memory cells employing pinned reference layers, it is not uncommon for fringe fields of the reference layer to extend from the reference layer into the data layer and act as a demagnetizing field upon the data layer. [you had magnetization right in earlier version, why did you change it back to fields???]

The result of this demagnetization field in prior art reference layers is an offset in the sense layer hysteresis loop, and thus the required switching field will be assymetric. This resultant asymmetry in the switching characteristics of the bit means that the amount of switching field needed to switch the bit from parallel to anti-parallel state is different from the switching field needed to switch the bit from anti-parallel state to parallel state. To have reliable switching characteristics and to simplify the read/write circuitry, it is desirable to have this offset reduced to as near zero as possible.

Since NiFe has a lower saturation magnetization than CoFe, using NiFe in the multilayer PRL 308 reduces the demagnetizing field of the multilayer PRL 308 upon the data layer 302, as compared to a single CoFe layer. Thus, whether occurring in a top-pinned SVM or bottom-pinned SVM, the multilayer PRL 308 is advantageous. More specifically, as the demagnetizing fringe fields of the multilayer PRL 308 is reduced, the data layer 304 of the SVM 302 may have a lower offset then would otherwise be required in the presence of a typical pinned layer demagnetizing field. Such a reduction in offset may directly reduce the magnitude of the required switching currents, and the associated power supplying transistors.

It is understood and appreciated that although the above discussions have pertained generally to magnetic memory cells 302, the discussions pertaining to the structure carry over to magnetic read devices such as read heads for hard drives, or any other magnetic field read sensor. In such a setting the data layer 304 is termed a sense layer and is oriented by a magnetic field emanating from a storage bit, rather than from a field provided by, for example a row and a column conductor.

Another embodiment may be appreciated to be a computer system incorporating the multilayer PRL 308. A computer with a main board, CPU and at least one memory store comprising an embodiment of the multilayer PRL 308 described above raises the advantages of the improved SVM's to a system level.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

We claim:

1. A multilayer pinned reference layer for a magnetic device comprising:
    at least one first layer of ferromagnetic material;
    at least one second layer of ferromagnetic material in physical contact with the first layer forming a combined ferromagnetic layer; and
    at least one AFM layer coupled to the combined ferromagnetic layer;
    wherein the at least one first layer and the at least one second layer interact to self-seed and provide <111> crystal texture within the reference layer, the self-seeding property occurring independent of an underlying substrate.

2. The multilayer pinned reference layer of claim 1, wherein when given an appropriate anneal the AFM layer provides an exchange field greater than the coercivity the reference layer.

3. The multilayer pinned reference layer of claim 1, wherein the magnetic device is a top pinned spin valve device.

4. The multilayer pinned reference layer of claim 1, further including an anti-ferromagnetic material layer in contact with the second layer.

5. The multilayer pinned reference layer of claim 1, wherein the first layer is CoFe and the second layer is NiFe.

6. The multilayer pinned reference layer of claim 5, wherein the first layer has a uniform thickness of between about 0 to 5 nanometers.

7. The multilayer pinned reference layer of claim 5, wherein the second layer has a uniform thickness of between about 0 to 4 nanometers.

8. The multilayer pinned reference layer of claim 1, wherein the first and second layers magnetically act as one and are predisposed to form an exchange bias with a provided anti-ferromagnetic material in the presence of an appropriate annealing process and a magnetic field.

9. A multilayer pinned reference layer for a magnetic storage device, comprising:
    at least one first layer of CoFe with a uniform thickness of between about 0 to 5 nanometers;
    at least one second layer of NiFe with a uniform thickness of between about 0 to 4 nanometers, the second layer magnetically coupled to the first layer forming a combined ferromagnetic layer; and
    at least one AFM layer coupled to the combined ferromagnetic layer;
    wherein the layer of CoFe and the layer of NiFe interact to self-seed and provide <111> crystal texture within the reference layer, the self-seeding property occurring independent of an underlying substrate.

10. The multilayer pinned reference layer of claim 9, wherein when given an appropriate anneal the AFM layer provides an exchange field greater than the coercivity the reference layer.

11. The multilayer pinned reference layer of claim 9, wherein the first and second layers are in direct physical contact.

12. The multilayer pinned reference layer of claim 11, further including an anti-ferromagnetic material layer in contact with the second layer.

13. The multilayer pinned reference layer of claim 11, wherein the first and second layers magnetically act as one and are predisposed to form an exchange bias with a provided anti-ferromagnetic material in the presence of an appropriate annealing process and a magnetic field.

14. A magnetic memory device comprising:
    at least one ferromagnetic data layer characterized by an alterable orientation of magnetization;
    an intermediate layer in contact with the data layer;
    a multilayer pinned ferromagnetic reference layer in contact with the intermediate layer, opposite the data layer, the reference layer characterized by;
    at least one first layer of ferromagnetic material; and
    at least one second layer of ferromagnetic material in physical contact with the first layer, the second layer magnetically coupled to the first layer forming a combined ferromagnetic layer; and at least one AFM layer coupled to the combined ferromagnetic layer;

wherein the at least one first layer and the at least one second layer interact to self-seed and provide <111> crystal texture within the reference layer, the self-seeding property occurring independent of an underlying substrate; and wherein the first and second layers hold a pinned magnetic field.

15. The magnetic memory device of claim 14, wherein the pinned magnetic field of the pinned reference layer does not substantially overlap the data layer.

16. The magnetic memory device of claim 14, wherein the multilayer pinned ferromagnetic reference layer is above the data layer, establishing a top-pinned spin device.

17. The magnetic memory device of claim 14, wherein the multilayer pinned ferromagnetic reference layer is below the data layer, establishing a bottom-pinned spin device.

18. The magnetic memory device of claim 14, wherein the pinning magnetic field is substantially localized within the multilayer pinned reference layer.

19. The magnetic memory device of claim 14, wherein the first layer is CoFe and the second layer is NiFe.

20. The magnetic memory device of claim 19, wherein the first and second layers magnetically act as one and are predisposed to form an exchange bias with a provided anti-ferromagnetic material in the presence of an appropriate annealing process and a magnetic field.

21. The magnetic memory device of claim 19, wherein the first layer has a uniform thickness of between about 0 to 5 nanometers.

22. The magnetic memory device of claim 19, wherein the second layer has a uniform thickness of between about 0 to 4 nanometers.

23. The magnetic memory device of claim 14, wherein the pinned magnetic field of the pinned reference layer does not substantially overlap the data layer.

24. The magnetic memory device of claim 14, wherein the first layer is CoFe and the second layer is NiFe.

25. The magnetic memory device of claim 24, wherein the first and second layers magnetically act as one and are predisposed to form an exchange bias with a provided anti-ferromagnetic material in the presence of an appropriate annealing process and a magnetic field.

26. The magnetic memory device of claim 24, wherein the first layer has a uniform thickness of between about 0 to 5 nanometers.

27. The magnetic memory device of claim 24, wherein the second layer has a uniform thickness of between about 0 to 4 nanometers.

28. The magnetic memory device of claim 14, wherein the intermediate layer is a dielectric.

29. The magnetic memory device of claim 14, wherein the intermediate layer is a non-magnetic metal unsuitable to seed for <111> crystal texture.

30. A magnetic sensor device comprising:
   at least one ferromagnetic sense layer characterized by an orientation of magnetization alterable in response to a magnetic field;
   an intermediate layer in contact with the sense layer;
   a multilayer pinned ferromagnetic reference layer in contact with the intermediate layer, opposite the sense layer, the reference layer characterized by;
   at least one first layer of ferromagnetic material; and
   at least one second layer of ferromagnetic material in physical contact with the first layer, the second layer magnetically coupled to the first layer forming a combined ferromagnetic layer; and
   at least one AFM layer coupled to the combined ferromagnetic layer;
   wherein the at least one first layer and the at least one second layer interact to self-seed and provide <111> crystal texture within the reference layer, the self-seeding property occurring independent of an underlying substrate; and
   wherein the first and second layers hold a pinned magnetic field.

31. The magnetic memory device of claim 30, wherein the first layer is CoFe and the second layer is NiFe.

32. The magnetic memory device of claim 31, wherein the first and second layers magnetically act as one and are predisposed to form an exchange bias with a provided anti-ferromagnetic material in the presence of an appropriate annealing process and a magnetic field.

33. The magnetic sensor device of claim 30, wherein the intermediate layer is a dielectric.

34. The magnetic sensor device of claim 30, wherein the intermediate layer is a non-magnetic metal unsuitable to seed for <111> crystal texture.

35. A computer system comprising:
   a main board;
   at least one central processing unit (CPU) coupled to the main board; and
   at least one memory store joined to the CPU by the main board, the memory store having a plurality of memory cells, each memory cell including:
   at least one ferromagnetic data layer characterized by an alterable orientation of magnetization;
   an intermediate layer in contact with the data layer;
   a multilayer pinned ferromagnetic reference layer in contact with the intermediate layer, opposite the data layer, the reference layer characterized by;
   at least one first layer of ferromagnetic material; and
   at least one second layer of ferromagnetic material in physical contact with the first layer, the second layer magnetically coupled to the first layer forming a combined ferromagnetic layer; and
   at least one AFM layer coupled to the combined magnetic layer;
   wherein the at least one first layer and the at least one second layer interact to self-seed and provide <111> crystal texture within the reference layer, the self-seeding property occurring independent of an underlying substrate; and
   wherein the first and second layers hold a pinned magnetic field.

36. The computer system of claim 35, wherein the intermediate layer is a dielectric.

37. The computer system device of claim 35, wherein the intermediate layer is a non-magnetic metal unsuitable to seed for <111> crystal texture.

* * * * *

UNITED STATES PATENT AND TRADEMARK OFFICE
CERTIFICATE OF CORRECTION

PATENT NO.        : 7,167,391 B2                                          Page 1 of 1
APPLICATION NO.   : 10/775807
DATED             : January 23, 2007
INVENTOR(S)       : Manish Sharma et al.

It is certified that error appears in the above-identified patent and that said Letters Patent is hereby corrected as shown below:

In column 6, line 46, after "at" insert -- least --.

Signed and Sealed this

Seventeenth Day of February, 2009

JOHN DOLL
*Acting Director of the United States Patent and Trademark Office*